(12) United States Patent
Pan

(10) Patent No.: US 6,259,139 B1
(45) Date of Patent: Jul. 10, 2001

(54) EMBEDDED WELL DIODE MOS ESD PROTECTION CIRCUIT

(75) Inventor: Jui-Hsiang Pan, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/476,655

(22) Filed: Dec. 31, 1999

(51) Int. Cl.[7] ............................. H01L 23/62; H01L 29/00
(52) U.S. Cl. .................. 257/355; 257/356; 257/546; 257/547
(58) Field of Search ............................. 257/355, 356, 257/371, 373, 546, 547

(56) References Cited

U.S. PATENT DOCUMENTS 5,158,899 * 10/1992 Yamagata ............................. 437/27
5,847,429 * 12/1998 Lien et al. ............................. 257/355

\* cited by examiner

*Primary Examiner*—Tom Thomas
*Assistant Examiner*—Ori Nadav

(57) ABSTRACT

The present invention is related to a MOS ESD protection circuit with embedded well diodes. The proposed protection circuit comprises following basic components: a well locates in a substrate; some transistors that locate in and on the well, wherein gates of transistors are located on the well, drains and sources of transistors are located in the well, and each drain is located between two adjacent sources; a pair of embedded wells that are adjacent to the well and are in contact with opposite sides of the well, herein depth of any embedded well is larger than depth of any source and depth of any drain; a guard ring that locates in the substrate, wherein guard ring surrounds well and passes through embedded wells; a pair of auxiliary doped regions that locate in the embedded well, where each auxiliary doped region and guard ring is separated by an additional isolations; some second conductive lines that couple gates with a relative ground point, these second conductive lines also couple guard ring and sources with said relative ground point; and some first conductive lines that couple drains and auxiliary doped regions with a terminal. Moreover, substrate, well and guard ring are corresponding to a first electricity, such as positive electricity or negative electricity. And, sources, drains, embedded wells and auxiliary doped regions are corresponding to second electricity that is different to the first electricity.

15 Claims, 5 Drawing Sheets

EMBEDDED WELL DIODE MOS ESD PROTECTION CIRCUIT

BACKGROUND OF THE INVENTION

1. Field of the Invention

This invention relates to a structure of MOS ESD (electrostatic discharge) protection circuit. And more specifically, this invention relates to a MOS ESD protection circuit that minimizes heating effect by embedded well diode.

2. Description of the Prior Art

Electrostatic discharge phenomena in integrated circuits have grown in importance as technologies shrink to below 0.5 microns and the number of transistors on a single chip approach the 5 million mark. The high voltages result in large electrical fields and high current densities in the small devices that can lead to breakdown of insulators and thermal damage in the integrated circuits. Therefore, ESD protection circuit is necessary for integrated circuits and then introduction of each new generation of semiconductor technology results in new challenges in terms of ESD capability and protection circuit design.

The relation between other parts of integrated circuits and an ESD protection circuit that used to protect chips from external charge/voltage is shown in FIG. 1. As FIG. 1 shows, external current (charger) is conducted from terminal 10 through internal buffer 12 to internal chips 13, and internal current (charger) is conducted from internal chips 13 through internal buffer 12 to terminal 10. However, because larger external current will induce unexpected damage on internal chips 13, ESD protection circuits 11 are used where ESD protection circuits 11 are located between terminal 10 and internal buffer 12. Moreover, ESD protection circuits 11 are turn-off when no larger external current is appeared, and when larger external current appears ESD protection circuits 11 are turned on automatically. Therefore, larger external current is conducted to VDD 14 and VSS 15, and internal chips 13 are not damaged.

There are many varieties of ESD protect circuit, and one useful variety of ESD protection circuits is the metal-oxide-semiconductor (MOS) protect circuit that uses MOS transistor to form required ESD protection circuit. Herein, advantages of MOS ESD protection circuit include high integration and high reliability. Significantly, when integration of integrated circuits are increased, MOS ESD protection circuit is more attractive for it can reduce occupied area of ESD protection circuit to further increase integration.

As the cross-sectional figure shown in FIG. 2A where conventional structure of MOS ESD protection circuit is qualitative illustrated. The MOS ESD protection circuit is form in and on well 22, and is surrounded by isolation 21 to prevent the protection circuit is interfered with other parts of substrate 20. Herein, a plurality of MOS transistors are located in and on well 22, and these MOS transistors are surrounded by guard ring 26. Moreover, drains 24 are coupled to terminal 27 by first conductive lines 28, and sources 23, gates 25 and guard ring 26 are coupled to relative ground point 295 by second conductive line 29. Beside, conventional layout of MOS ESD protection circuit is qualitative illustrated in FIG. 2B, where FIG. 2A is a cross-sectional illustration along AA line. Moreover, relative ground point 295 usually is provided by substrate 20.

Mechanism of the MOS ESD protection circuit can briefly described as following: when chargers is appeared on terminal 27 and more then threshold value of the MOS ESD protection circuit, they are conducted to drains 24 by first conductive lines 28. Then, owing to the fact extra charges induce electrical field and alter distribution of charge carriers inside substrate 20 and well 22, some parasitic bipolar junction transistors that located under drains 24 and sources 23 are formed, and then extra chargers are conducted grounded point 295. One advantages of MOS ESD protection circuit is that current gain of bipolar junction transistors can enhance the protect ability of ESD protection circuit. Moreover, numerous parasitic diodes are formed under gates 25. Thus, though trigger time of bipolar junction transistors is slow, before parasitic bipolar junction transistors are triggered, extra chargers also are conducted to grounded point 295 by parasitic diodes and first conductive lines 29.

However, an unavoidable deficiency of conventional MOS ESD protection circuit is that parasitic diodes induce a large electrical field on depletion region that around both sources 23 and drains 24. Therefore, owing to high electrical field may induce quantities of heat, it is possible that parasitic diodes are overburning by heat before so-called parasitic bipolar junction transistors are triggered, and then ESD protection circuit can not properly protect chips inside integrated circuits, even parasitic bipolar junction transistors are triggered later.

In summary, because conventional MOS ESD protection circuit faces the issue that parasitic diodes are destroyed before parasitic bipolar junction transistors are triggered, it is desired to modify structure of MOS ESD protection circuit to make sure that internal chips are properly protect since chargers appear on terminal, no matter parasitic bipolar junction transistors are trigger or not.

SUMMARY OF THE INVENTION

A primary object of the invention is to provide a MOS ESD protection circuit that properly protect chips inside integrated circuits when chargers appear on terminal, no matter parasitic bipolar junction transistors are trigger or not.

A concrete object of the invention is to propose an ESD protection circuit that quality of it is not sensitively depends on fabricating process, especially not sensitively depends on parameters of fabricating process.

A further object of the invention is to provide a new way to protect chips inside integrated circuits before parasitic bipolar junction transistors of ESD protection circuit are triggered.

Another object of this invention is to propose a manufacturable MOS ESD protection circuit.

One essential embodiment of the invention is a MOS ESD protection circuit with embedded well diodes. The proposed protection circuit comprises following basic components: a well locates in a substrate; some transistors that locate in and on the well, wherein gates of transistors are located on the well, drains and sources of transistors are located in the well, and each drain is located between two adjacent sources; a pair of embedded wells that are adjacent to the well and are in contact with opposite sides of the well, herein depth of any embedded well is larger than depth of any source and depth of any drain; a guard ring that locates in the substrate, wherein guard ring surrounds well and passes through embedded wells; a pair of auxiliary doped regions that locate in the embedded well, where each auxiliary doped region and guard ring is separated by an additional isolations; some second conductive lines that couple gates with a relative ground point, these second conductive lines also couple guard ring and sources with said relative ground point; and some first conductive lines that couple drains and auxiliary doped regions with a terminal. Moreover, substrate, both well and guard ring are corresponding to a first electricity, such as positive electricity or negative electricity. And, sources, drains, embedded wells and auxiliary doped regions are corresponding to second electricity that is different to the first electricity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE PREFERRED EMBODIMENT

Figure 1:
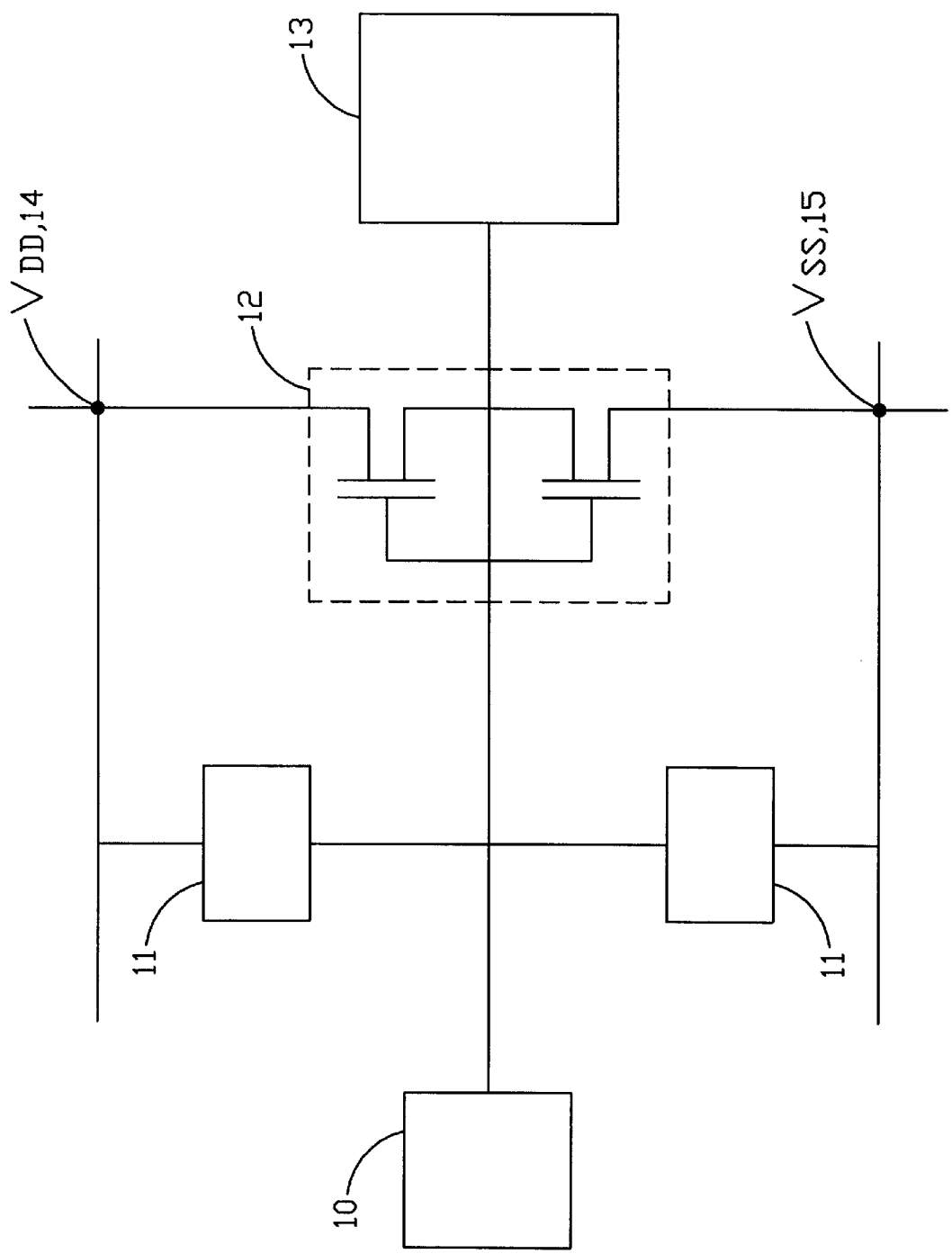
FIG. 1 briefly illustrates relation between ESD protection circuit and other parts of integrated circuits.
Figure 2A:
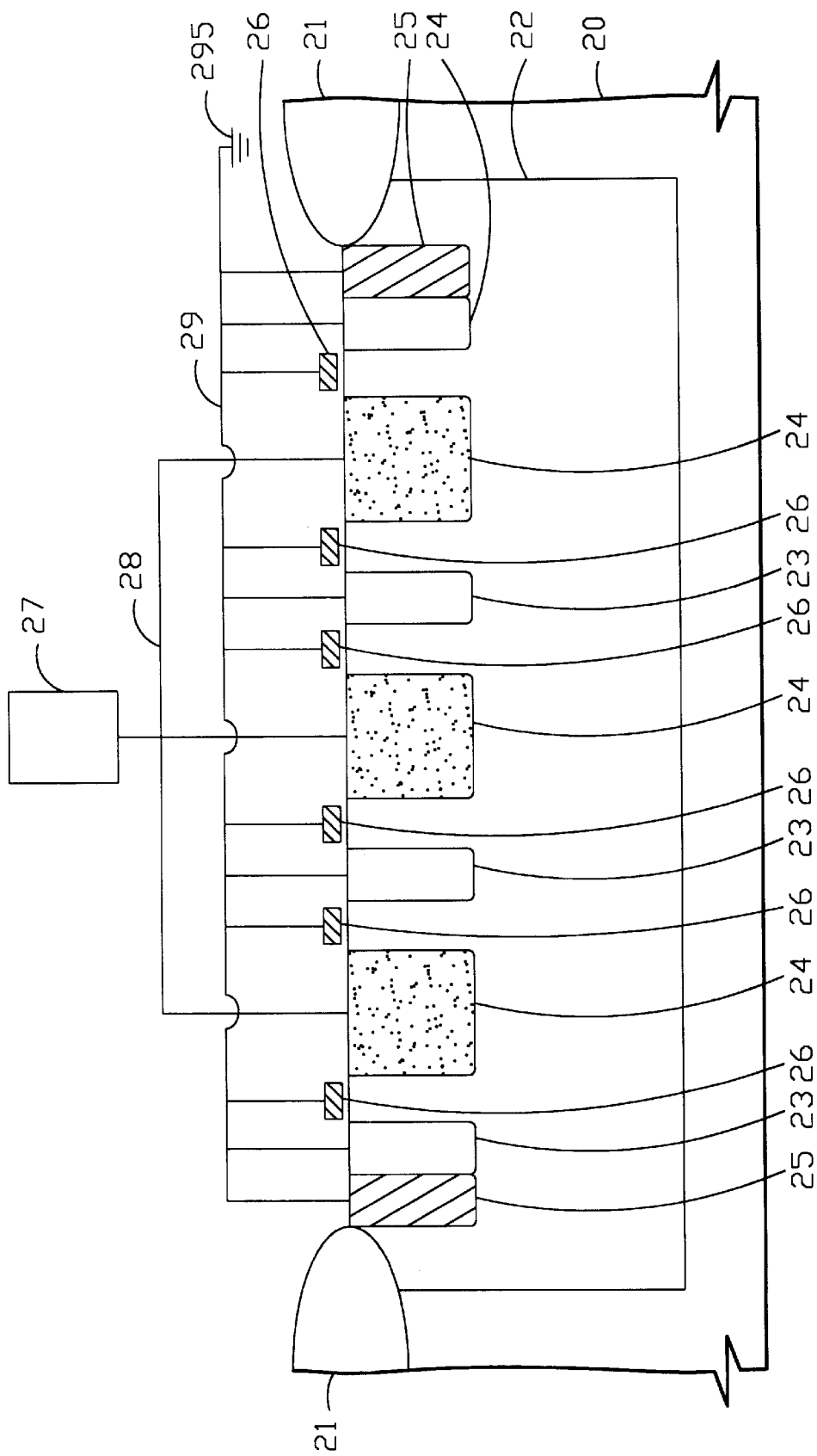
FIG. 2A briefly illustrates a cross-sectional illustration of a well-known MOS ESD protection circuit.
Figure 2B:
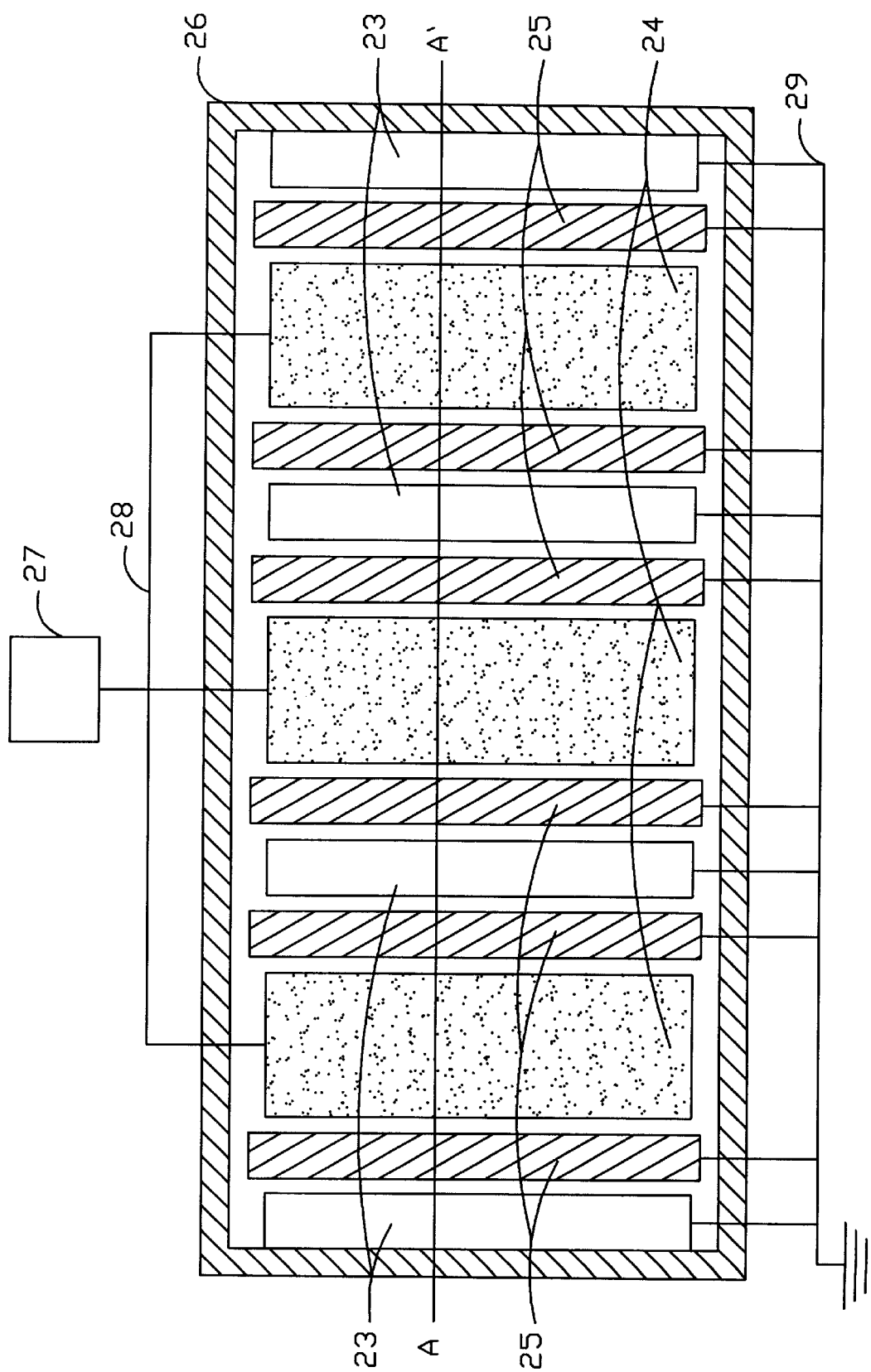
FIG. 2B briefly illustrates a top-view illustration of a well-known MOS ESD protection circuit.
Figure 3A:
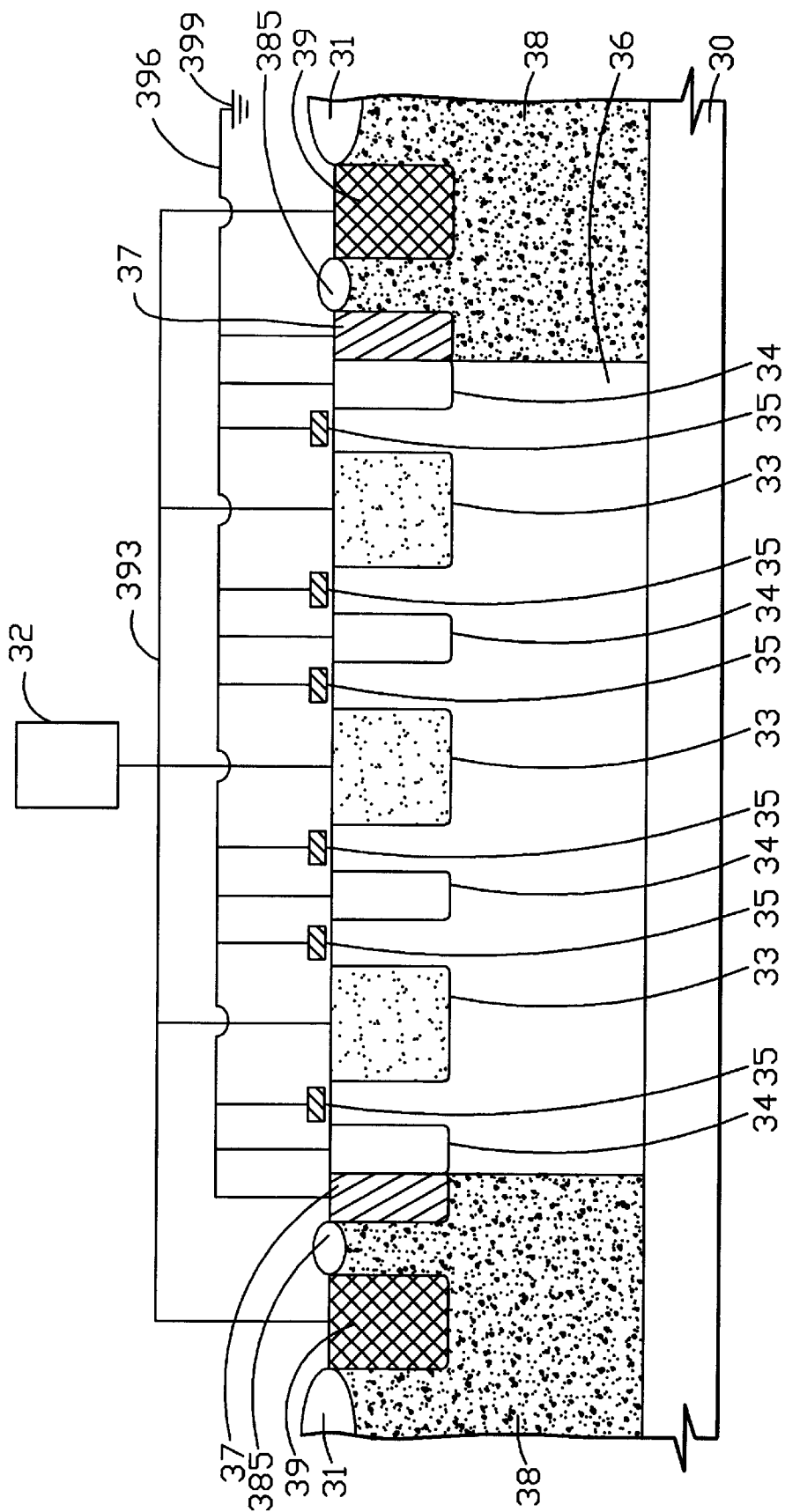
FIG. 3A briefly illustrates a cross-sectional illustration of a MOS ESD protection circuit according to one preferred embodiment of the invention.
Figure 3B:
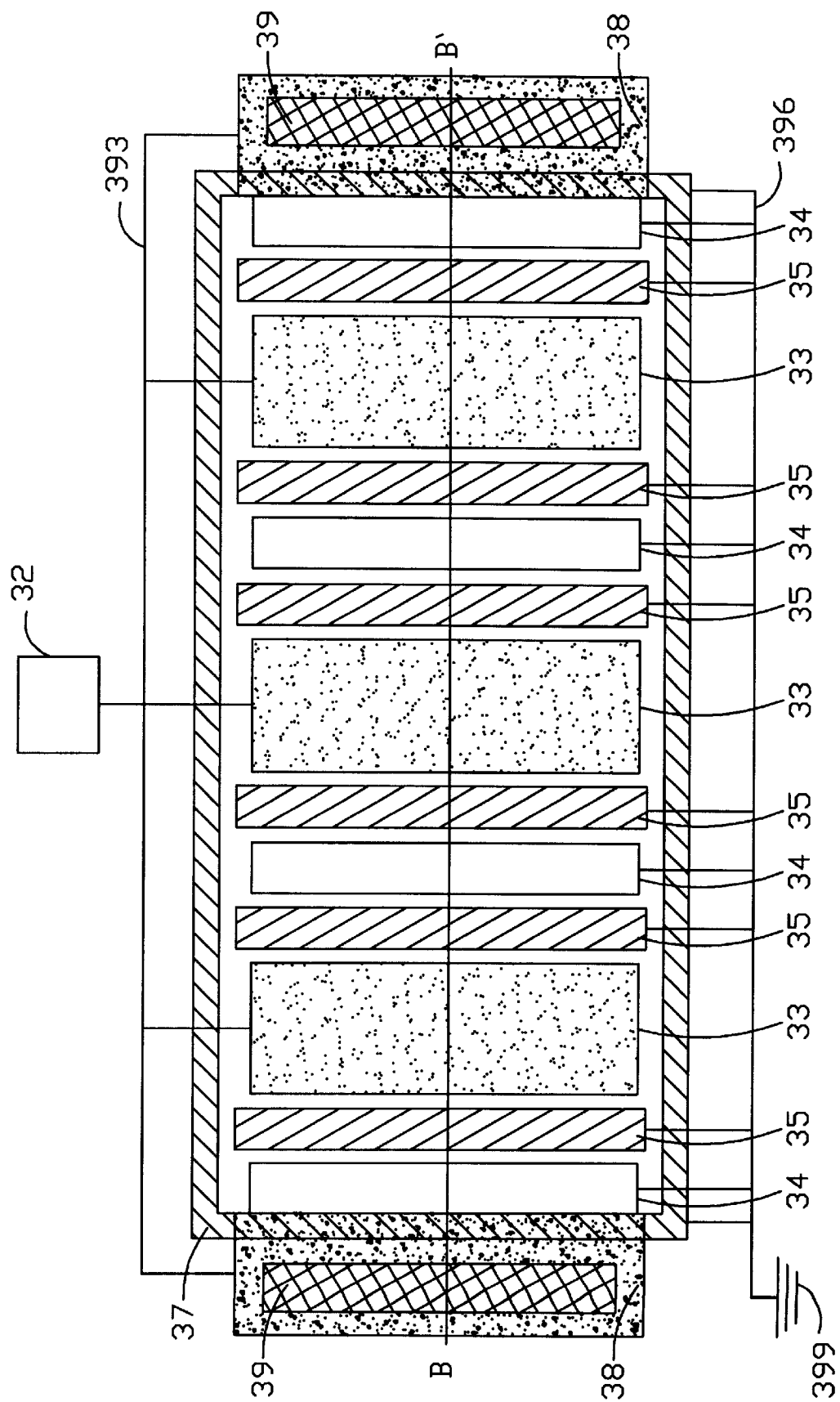
FIG. 3B briefly illustrates a top-view illustration of a MOS ESD protection circuit according to one preferred embodiment of the invention.

One preferred embodiment of the proposed invention is a MOS ESD protection circuit with embedded well diode. Referring to both FIG. 3A and FIG. 3B, wherein FIG. 3A is a cross-section illustration along BB line of FIG. 3B that is a top-view illustration. The present MOS ESD protection circuit is formed in and on substrate 30 and locates between isolations 31. Moreover, the present MOS ESD protection circuit comprises following elements: terminal 32, drains 33, sources 34, gates 35, well 36, guard ring 37, embedded wells 38, auxiliary doped regions 39, first conductive lines 393, second conductive lines 396 and relative ground point 399.

First of all, well 36 locates in substrate 30 and electricity of well 30 is equal to substrate 30, wherein available electricity of well 36 comprises positive electricity and negative electricity.

Drains 33, sources 34 and gates 35 compose a plurality of transistors in and on well 36, wherein, gates 35 locate on well 36 and both drains 33 and sources 34 locate in well 36. Moreover, each drain 33 is located between two adjacent sources 34, and electricity of both sources 34 and drains 33 is different to electricity of well 36. In addition, sources 34 can be a plurality of shallow junctions that depth is less than about 1000 angstroms, and drains also can be a plurality of shallow junction with a depth less than about 1000 angstroms.

There is a pair of embedded wells 38 in one present protection circuit. Embedded wells 38 are adjacent to well 36 and are in contact with opposite sides of well 36. Herein electricity of embedded wells 38 is different to electricity of well 36, and depth of each embedded well 38 is larger than depth of any source 34 and depth of any drain 33.

Guard ring 37 locates in substrate 30 and surrounds well 36, and electricity of guard ring 37 is different to electricity of embedded wells 38. Herein, guard ring 37 passes through embedded wells 38.

Furthermore, relative ground point 399 is located inside substrate 30 and terminal 32 comprises pad.

Moreover, there is a pair of auxiliary doped regions 39 in embedded well 38, where each auxiliary doped regions 39 and well 32 are separated by guard ring 37. Further, each auxiliary doped region 39 and guard ring 37 can be separated by additional isolation 385. Additional, electricity of auxiliary doped regions 39 is equal to electricity of embedded well 38.

Furthermore, first conductive lines 393 are used to couple both drains 33 and auxiliary doped regions 39 with terminal 32. And second conductive lines 396 are used to couple gates 35 with relative ground point 395, wherein second conductive lines 396 also couple both guard ring 37 and sources 34 with relative ground point 399.

Mechanism of the present MOS ESD protection circuit can briefly described as following discussion:

First of all, function of these MOS transistors in and on well 36 are equal to conventional MOS ESD protection circuit, both parasitic bipolar junction transistors and parasitic diodes are used to conduct chargers that appears on terminal 32. And then advantages and deficiencies of conventional MOS ESD protection circuit also are happened in MOS transistors of the present ESD protection circuit. However, because first conductive lines 393 conduct chargers to both drains 33 and auxiliary doped regions 39, it is crystal-clear that auxiliary doped regions 39, through embedded wells 38, also form two additional diodes between embedded wells 38 and substrate 30.

Of course, heats also are formed in depletion regions of these diodes, but depletion regions of parasitic diodes are located inside well 36, but depletion regions of additional diodes are located outside well 36 and inside substrate 30. Thus, some significantly advantages of the invention are appeared: First, area of depletion region is increased and strength of electrical field is decreased, then heat induced by electrical field also is decreased. Second, maximum electrical field appears in substrate 30 and substrate 30 behaves as a heat reservoir. Thus, heat is absorbed by substrate 30 and structure of the present MOS ESD protection circuit will not be damaged by heat. Third, even all parasitic diodes are destroyed before parasitic bipolar junction transistors are triggered, chargers on terminal 32 also are conducted to some relative ground point by additional diodes, therefore, chips inside integrated circuits are properly protected by the present protection circuit.

Moreover, another advantage of the present ESD protection circuit is that embedded wells 38 locate outside well 36. Thus, though width of any embedded well 38 is larger than width of any drain 33 or any sources 34, area of well 36, or surrounded area of guard ring 37, is equal to area of conventional MOS ESD protection circuit. It is valuable for though ESD protection circuits is essential for integrated circuits, it is better to minimize size of ESD protection circuits to enhance integration of integrated circuits.

Furthermore, because practical integrated circuits must balance requirements of both high integration and high ESD protecting ability, the present MOS ESD protection circuit can further comprising a plurality of additional wells that each drain 33 is located in one of these additional wells. Herein, electricity of each additional well is equal to electricity of embedded wells 38, and depth of each additional well is larger than depth of well 36. In other words, additional diodes are formed under these drains 33 and then damage of electric field is farther decreased, and only disadvantage is size of ESD protection circuit is increased.

In addition, according to previous discussion, it is obvious that each outmost source 34 can be located in both well 36 and embedded well 38, wherein each so-called outmost source 34 is attached to guard ring 37. Obviously, mechanism of the invention does not depend on the boundary structure between well 36 and embedded wells 38.

Obviously, numerous additional modifications and variations of the present invention are possible in light of the above teachings. It is therefore to be understood that within the scope of the appended claims, the invention may be practiced otherwise than as specifically described herein.

What is claimed is:

1. An MOS ESD protection circuit with embedded well diode, said circuit comprising:

a well in a substrate, wherein electricity of said well is equal to said substrate;

a plurality of transistors in and on said well, wherein a plurality of gates of said transistors are located on said well, a plurality of drains of said transistors being located in said well and a plurality of drains of said transistors being located in said well, wherein each said drain is located between two adjacent said sources, electricity of both said sources and said drains is different to electricity of said well;

a pair of embedded wells that are adjacent to said well and are in contact with opposite sides of said well, wherein electricity of said embedded wells is different to electricity of well, depth of each said embedded well is larger than depth of any said source and depth of any said drain;

a guard ring in said substrate, wherein said guard ring surrounds said well and passes through said embedded wells, electricity of said guard ring being different to electricity of embedded wells;

a pair of auxiliary doped regions in said embedded wells, wherein each said auxiliary doped region locates in one said embedded well, each said auxiliary doped region and said guard ring is separated by an additional isolation, electricity of said auxiliary doped regions being equal to electricity of said embedded wells;

a plurality of first conductive lines that couple said drains and said auxiliary doped regions with a terminal; and a plurality of second conductive lines that couple gates with a relative ground point, wherein said second conductive lines also couple said guard ring and said sources with said relative ground point.

2. The protection circuit according to claim 1, wherein electricity of said well comprises positive electricity.

3. The protection circuit according to claim 1, wherein electricity of said well comprises negative electricity.

4. The protection circuit according to claim 1, further comprising each outmost said source is located in both said well and said embedded well.

5. The protection circuit according to claim 4, wherein each outmost said source is attached to said guard ring.

6. The protection circuit according to claim 1, wherein each said auxiliary doped regions and said well are separated by said guard ring.

7. The protection circuit according to claim 1, wherein said sources are a plurality of shallow junctions.

8. The protection circuit according to claim 7, wherein depth of said shallow junction is less than about 1000 angstroms.

9. The protection circuit according to claim 1, wherein said drains are a plurality of shallow junction.

10. The protection circuit according to claim 9, wherein depth of said shallow junction is less than about 1000 angstroms.

11. The protection circuit according to claim 1, further comprising a plurality of additional wells that each said drain is located in one said additional well.

12. The protection circuit according to claim 11, wherein electricity of each said additional well is equal to electricity of said embedded wells.

13. The protection circuit according to claim 11, wherein depth of each said additional well is larger than depth of said well.

14. The protection circuit according to claim 1, wherein said relative ground point is located inside said substrate.

15. The protection circuit according to claim 1, wherein said terminal comprises pad.

* * * * *